United States Patent [19]

Duperray et al.

[11] Patent Number: 5,706,571
[45] Date of Patent: Jan. 13, 1998

[54] METHOD OF MANUFACTURING A SHEATHED TWISTED SUPERCONDUCTOR HAVING A HIGH CRITICAL TEMPERATURE

[75] Inventors: Gérard Duperray, La Norville; Erick Beghin, Orleans; Denis Legat, Lisses; Peter Friedrich Herrmann, Corbreuse, all of France

[73] Assignee: Alcatel Alsthom Compagnie Generale D'Electricite, Paris, France

[21] Appl. No.: 713,698

[22] Filed: Sep. 13, 1996

[30] Foreign Application Priority Data

Sep. 14, 1995 [FR] France ................ 95 10764

[51] Int. Cl.⁶ .............................................. H01L 39/24
[52] U.S. Cl. .................... 29/599; 174/125.1; 174/126.1; 505/886
[58] Field of Search ........................... 29/599; 174/125.1, 174/128.1; 505/886

[56] References Cited

U.S. PATENT DOCUMENTS

| | | |
|---|---|---|
| 3,760,092 | 9/1973 | Woolcook et al. ............ 179/128.1 |
| 4,611,390 | 9/1986 | Tanaka et al. . |
| 5,073,679 | 12/1991 | Beneharal et al. .............. 505/886 X |
| 5,200,577 | 4/1993 | Shimada .......................... 505/887 X |

FOREIGN PATENT DOCUMENTS

| | | |
|---|---|---|
| 0503525A1 | 9/1992 | European Pat. Off. . |
| 0509436A3 | 10/1992 | European Pat. Off. . |
| 0638942A1 | 2/1995 | European Pat. Off. . |
| 56-7487 | 1/1981 | Japan ...................... 29/599 |
| 63-190213 | 8/1988 | Japan ...................... 29/599 |
| 3-163713 | 7/1991 | Japan ...................... 29/599 |
| 4-22015 | 1/1992 | Japan ...................... 29/599 |
| 4-149915 | 5/1992 | Japan ...................... 29/599 |
| 637056 | 3/1982 | U.S.S.R. .................. 29/599 |

*Primary Examiner*—Carl J. Arbes
*Attorney, Agent, or Firm*—Sughrue, Mion, Zinn, Macpeak & Seas, PLLC

[57] ABSTRACT

A sheathed twisted superconductor with a high critical temperature is made from a billet obtained by assembling square cross-section single strands in a square cross-section metal tube. The multistrand obtained by drawing the billet through a roller die is twisted with a particular lay and rolled using rollers the diameter of which is much greater than the twist lay. The sheathed twisted superconductor obtained by this method is intended for variable current applications.

7 Claims, 1 Drawing Sheet

METHOD OF MANUFACTURING A SHEATHED TWISTED SUPERCONDUCTOR HAVING A HIGH CRITICAL TEMPERATURE

BACKGROUND OF THE INVENTION

1. Field of the Invention

The invention concerns a method of manufacturing a sheathed twisted superconductor having a high critical temperature.

A twisted conductor of this kind is intended in particular for variable current applications in a high magnetic field.

2. Description of the Prior Art

The manufacture of a sheathed twisted superconductor from round (i.e. circular or oval cross-section) superconductor filaments is known in itself. A circular cross-section billet is made from an assembly of round single strands inside a cylindrical metal tube. The billet is drawn by passing it through a circular die to obtain a round multistrand. The multistrand is twisted and the twisted multistrand is rolled to obtain the required dimensions of the sheathed twisted superconductor.

An object of the invention is to propose another method of manufacturing a sheathed twisted superconductor having a high critical temperature.

SUMMARY OF THE INVENTION

To this end, the invention consists in a method of manufacturing a sheathed twisted superconductor having a high critical temperature wherein the sheathed conductor is made from a billet made from an assembly of square cross-section single strands in a square cross-section metal tube.

It has been found that a multistrand obtained by drawing the square cross-section billet through a roller die or a friction die is better able to withstand a twisting operation than a multistrand made from a circular cross-section billet as referred to above. In particular, the multistrand obtained in this way can be twisted with a shorter lay, which is particularly advantageous in variable current applications in which a lay of a few millimeters is required, after rolling the twisted multistrand, to minimize energy losses. Tests have shown that a square cross-section multistrand made using a roller die can be twisted with a lay of less than 5 mm, whereas with a lay of this size a circular cross-section multistrand made from a circular cross-section billet exhibits cracks.

The billet is advantageously drawn by passing it through a roller die to obtain a square cross-section multistrand that is twisted with a particular lay and rolled using rolls having a diameter at least ten times greater than the lay to obtain the required dimensions of the sheathed twisted conductor. A method of this kind reduces the manufacturing time of the sheathed twisted conductor compared to the prior art methods mentioned above because the major part of the reduction of the diameter by drawing is carried out in a roller die that is much more free running than a circular friction die. Drawing through a roller die causes less damage, compared to a circular die, to the material of the metal tube from which the billet is made because it produces lower friction loads. It is therefore possible to make a billet using a relatively thin metal tube. If the tube is based on silver alloys, application of the method of the invention significantly reduces the manufacturing costs of the sheathed twisted conductor. Further, drawing through a roller die produces relatively flat metal/superconductor interfaces. This enhances the texturing of the sheathed twisted superconductor. The square cross-section superconductor filaments remain well separated from each other and retain a constant cross-section without interruption of the superconductor cores, the assembly remaining geometrically similar with like edges parallel "homothetic".

The square cross-section billet may be drawn through a friction die to obtain a polygonal cross-section multistrand, in particular a hexagonal cross-section if the application requires it, although this has the drawback of requiring a thicker metal tube. Nevertheless, this multistrand has a twistability comparable with that of the square cross-section multistrand. Alternatively, the billet is drawn first through a roller die and then through a friction die, which makes it possible to change from a square cross-section to a cross-section having some other geometry, if the application requires it, for example a polygonal and in particular a hegaxonal geometry or a circular geometry. In this case the cross-section reduction coefficient applied at the friction die is preferably much lower than that applied at the roller die, i.e. the cross-section of the square cross-section multistrand obtained at the exit of the roller die is close to the final cross-section of the polygonal or circular cross-section multistrand. In all cases, the twistability of the multistrand is preserved whilst protecting the material of the metal tube.

One embodiment of the method of the invention is described hereinafter in more detail.

DETAILED DESCRIPTION OF THE PREFERRED EMBODIMENT

In what follows, the term "square" must be understood as meaning "substantially square".

Figure 1:
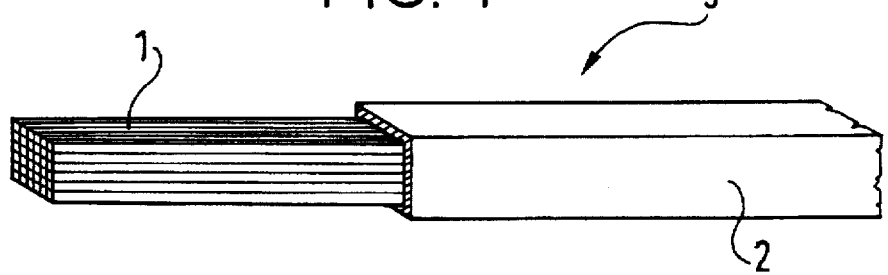
FIGS. 1 through 4 show the various steps of the method of the invention.

Referring to FIG. 1, a number of superconductor single strands 1 are stacked and assembled together in a square cross-section metal tube 2 based on silver alloy or a resistive silver-alloy composite material, to constitute a square cross-section billet 3. Note that the single strands have a square cross-section, 1.2 mm by 1.2 mm in this example. They are made by the method described in document FR-A-2 675 620, except that no form factor is applied during drawing. The billet is constituted of eight by eight single strands, for example, having the dimensions indicated above and the tube 2 has a square interior cross-section 8 mm by 8 mm and a square exterior cross-section 10 mm by 10 mm.

Figure 2:
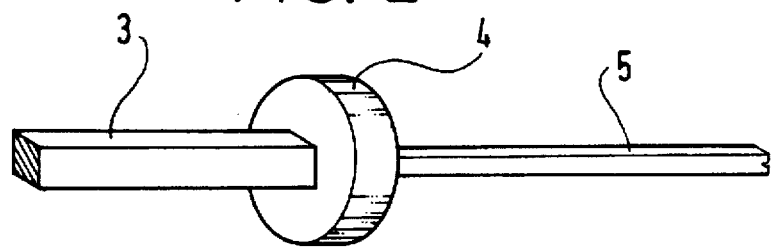

Referring to FIG. 2, the billet 3 is drawn through a roller die 4 (shown in a stylized manner) to obtain a square cross-section multistrand 5, 1.6 mm by 1.6 mm in this example. During drawing, the internal geometry of the single strands is preserved, i.e. the filaments remain separate from each other and retain a constant cross-section without interruption of the superconductor cores.

Figure 3:
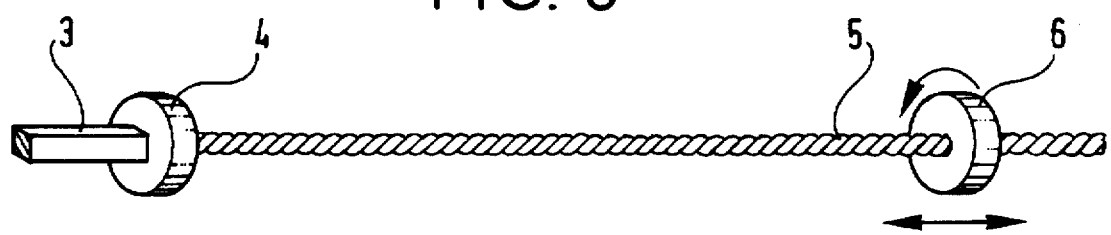

Referring to FIG. 3, on leaving the roller die 4 the multistrand 5 is twisted under tension with a particular lay (a lay of 5 mm in this example). This twisting is accompanied by a swelling of the multistrand at the expense of its length, which can be controlled to some degree through the tension applied by displacement of the end rotating jaw 6. In the case of a multistrand having a 2.56 mm$^2$ cross-section, the tension is adjusted to obtain an increase in diameter of less than 20%. In this example the final diameter of the twisted multistrand is about 2 mm.

Figure 4:
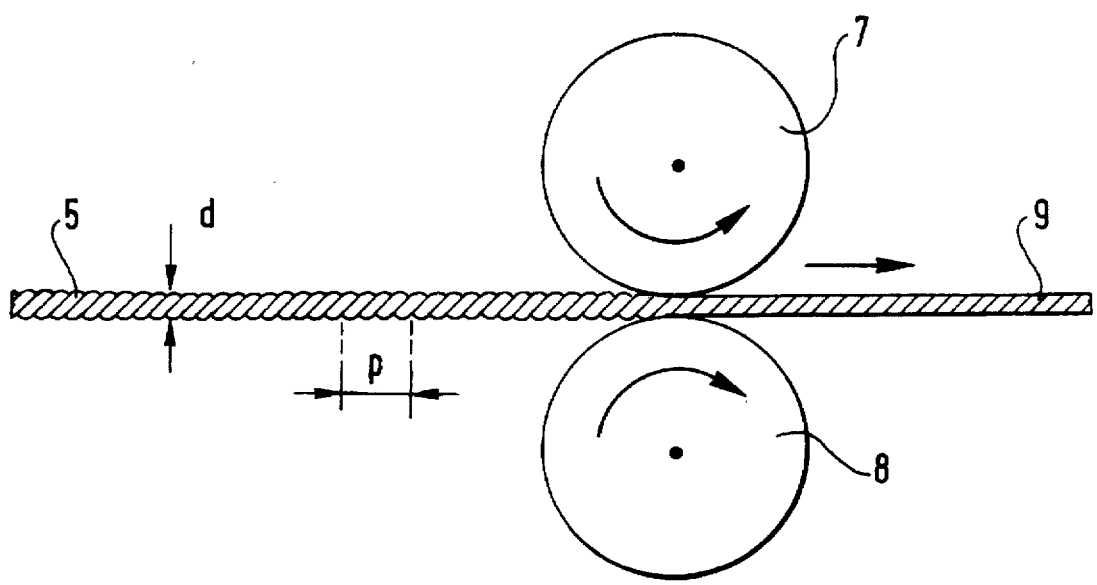

Referring to FIG. 4, the twisted multistrand 5 is rolled by passing it between two rolls 7 and 8 having a diameter at least ten times greater than the twisting lay p to obtain the required dimension of the sheathed twisted strip 9. Conclusive tests have been carried out for a twisted multistrand having a diameter d of approximately 2.4 mm, a twist lay of approximately 5 mm and rolls having a diameter of 250 mm in this example. During the rolling of this multistrand it is allowed to widen to 4 mm after which it is rolled at constant width to obtain a cross-section of 0.5 mm by 4 mm, which is a cross-section reduction of 36% corresponding to an elongation of 1.57, the final twist lay after rolling being 9.6 mm. This operation is possible only if the diameter of the rolls is large compared to the twist lay p as otherwise the multistrand would untwist. The widening of the multistrand at the start of rolling enables the elongation of the twisted conductor and therefore the increase in the twist lay to be controlled. In variable current applications it is desirable to use a superconductor having a twist lay of a few millimeters.

Note that the rolling step may be preceded by a calibration step using a friction die (not shown) to confer a cross-section of a different geometry on the multistrand, for example a polygonal and in particular a hexagonal or a circular cross-section. The circular cross-section prevents any untwisting of the strand during rolling. The cross-section reduction coefficient of the multistrand at the friction die must be very small, however, approximately 20%, i.e. much lower than that applied at the roller die. Alternatively, the billet 3 can be drawn directly in a friction die (not shown) to obtain a polygonal, for example hexagonal cross-section multistrand that also has good twistability.

There is claimed:

1. A method of manufacturing a sheathed twisted superconductor having a high critical temperature, comprising the following steps:

square cross-section single strands are assembled in a square cross-section metal tube to produce a square cross-section billet, said billet is drawn through a die to obtain a square cross-section multistrand, said multistrand is twisted with a particular lay, and said twisted multistrand is rolled to the required dimensions of said sheathed twisted superconductor.

2. The method claimed in claim 1 wherein said billet is drawn through a roller die.

3. The method claimed in claim 2 wherein said square cross-section multistrand is rolled with rolls having a diameter at least ten times greater than the twist lay.

4. The method claimed in claim 2 wherein said billet is drawn first through a roller die and then through a friction die, the cross-section reduction coefficient applied at said friction die being much less than that applied at said roller die.

5. The method claimed in claim 4 wherein said cross-section reduction coefficient applied at said friction die is approximately 20%.

6. The method claimed in claim 2 wherein said multistrand is twisted under tension to limit the increase of the cross-section of the multistrand to a value less than 20%.

7. The method claimed in claim 2 wherein said rolling is carried out in such manner as firstly to allow said multistrand to widen to a particular dimension and then to keep that dimension constant.

* * * * *